(12) United States Patent
Berman et al.

(10) Patent No.: US 6,894,762 B1
(45) Date of Patent: May 17, 2005

(54) DUAL SOURCE LITHOGRAPHY FOR DIRECT WRITE APPLICATION

(75) Inventors: Michael J. Berman, West Linn, OR (US); George E. Bailey, Welches, OR (US)

(73) Assignee: LSI Logic Corporation, Milpitas, CA (US)

( * ) Notice: Subject to any disclaimer, the term of this patent is extended or adjusted under 35 U.S.C. 154(b) by 233 days.

(21) Appl. No.: 10/246,286

(22) Filed: Sep. 17, 2002

(51) Int. Cl.[7] .................. G03B 27/32; G03B 27/44; G03B 27/54

(52) U.S. Cl. ...................... 355/46; 355/67; 355/70; 355/77

(58) Field of Search ................ 355/46, 67, 70, 355/77

(56) References Cited

U.S. PATENT DOCUMENTS

2003/0218730 A1 * 11/2003 Murakami et al. ............ 355/53

* cited by examiner

*Primary Examiner*—Rodney Fuller
(74) *Attorney, Agent, or Firm*—Beyer Weaver & Thomas, LLP

(57) ABSTRACT

A dual exposure source lithography system forms a first and a second portion of a pattern on a wafer. An optical lithography module forms the first portion of the pattern. A non-optical lithography module forms the second portion of the pattern using a non-optical lithography exposure source. The non-optical exposure source is an electron beam lithography source, an EUV source, an x-ray source, or another next generation lithography system exposure source. A mask design file is decomposed into separate design files reflecting critical and non-critical components of the pattern to be formed on the wafer.

31 Claims, 4 Drawing Sheets

Original Design

Non-Critical Components

Critical Components

Original Design

Non-Critical Write to Parameter

Critical Write for Remaining Image

DUAL SOURCE LITHOGRAPHY FOR DIRECT WRITE APPLICATION

BACKGROUND OF THE INVENTION

1. Field of the Invention

The present invention relates to lithography of semiconductor wafers. More particularly, the present invention relates to lithography using two lithography exposure sources to form a pattern.

2. Description of the Related Art

Semiconductor wafer fabrication involves a series of processes used to create semiconductor devices and integrated circuits (ICs) in and on a semiconductor wafer surface. Fabrication typically involves the basic operations of layering and patterning, together with others such as doping, and heat treatments. Layering is an operation used to add thin layers of material (typically insulator, semiconductor or conductor) to the surface of the semiconductor wafer. Patterning is an operation that is used to remove specific portions of the top layer or layers on the wafer surface. Patterning is usually accomplished through the use of photolithography (also known as photomasking) to transfer the semiconductor design to the wafer surface.

The push to maintain Moore's Law is producing smaller and smaller semiconductor circuits. To produce the smaller sized devices, the useful lifetime for equipment designed for particular device sizes is often extended by using resolution enhancement techniques (RETs) on the photomasks. This increases the resolution available from the equipment. For example, alternating phase shift mask techniques as well as other optical proximity correction techniques are applied to photomasks to enhance the printing of device features. But the mask cost to produce resolution enhancement techniques (RET's) is growing exponentially. For example, suitable phase shift masks costs nearly an order of magnitude more than a standard binary mask (i.e., a mask without resolution enhancement).

In specific, currently, standard binary masks may cost on the order of $12 k, but an alternating aperture phase shift mask (AAPSM) costs $100 k or more. Increased capital costs for photomasks employing resolution enhancement techniques will likely have disparate impacts on the semiconductor industries. The application specific integrated circuit (ASIC) and the system-on-chip (SoC) industries will likely be impacted the most since the majority of their customers use a mask set to process only a few lots whereas the memory and CPU industries will process hundreds or thousands of lots per mask set.

One approach to these problems is elimination of the mask from the lithography process by direct write e-beam approach. But direct write lithography is very slow. Conventional lithography can process up to 100 wafers/hour, but direct write lithography may take as long as a day to process one wafer. Thus, the cost of ownership for direct write lithography may be 1,000 times greater per wafer as compared to conventional lithography. Extended write times also create CD control and defect issues and are not practical at the current time.

Accordingly, it is desirable to provide a more effective method for performing high-resolution lithography which includes higher throughput rates and lower costs of ownership.

SUMMARY OF THE INVENTION

To achieve the foregoing, the present invention provides processes and apparatus for using dual source lithography for forming circuitry patterns on a wafer or other substrate. A dual lithography system provides a first exposure source for printing of features using conventional optical photolithography methods where the features size equals or exceeds a predetermined threshold and a second e-beam source for directly writing features smaller than the predetermined threshold, i.e., high-resolution features. Using such dual source lithographic means, the high throughput of conventional photolithographic processes may be used for a significant portion of the wafer while the high resolution low throughput means (i.e., the direct write e-beam method) may be used for wafer areas requiring resolution not achievable using the conventional optical photolithography. In this manner, the net throughput increases.

In one aspect, the present invention provides a dual source lithography system for forming a first and second pattern on the same resist layer of the wafer. The dual source lithography system includes a first lithography exposure source for forming the first components of the pattern and a second lithography exposure source for forming the second components of the pattern. One of the first and second components is a critical component and the other of the first and second components is a non-critical component. In one aspect, the dual source lithography system includes an optical lithography module for forming the non-critical components by exposing the wafer to an optical lithography exposure source. The dual source lithography system also includes a non-optical lithography module for forming the critical components of the pattern by exposing the wafer to a non-optical exposure source. In a preferred embodiment, the non-optical lithography module is a next generation lithography (NGL) module. In yet another preferred embodiment, the non-optical lithography module is an electron beam lithography system, an x-ray lithography system, laser direct write lithography system or an extreme ultraviolet lithography system.

In another aspect, the present invention provides a method of forming a first and second pattern on a wafer. The method involves forming the first pattern on a first portion of a wafer by exposing the first portion of the wafer to an optical lithography exposure source and forming the second pattern on a second portion of the wafer by exposing the second portion of the wafer to a non-optical exposure source. In one preferred embodiment, the non-optical lithography module is an electron beam lithography module configured for direct writing of a pattern on a photoresist layer of the wafer. In another preferred embodiment, the method includes importing, prior to exposing the first and second portions of the wafer, a photomask design file and exporting at least two design files, a first design file having features with a level of detail finer than a predetermined threshold and a second design file having a level of detail equal to or coarser than a predetermined threshold.

These and other features and advantages of the present invention are described below with reference to the drawings.

DETAILED DESCRIPTION OF PREFERRED EMBODIMENTS

Figure 1:
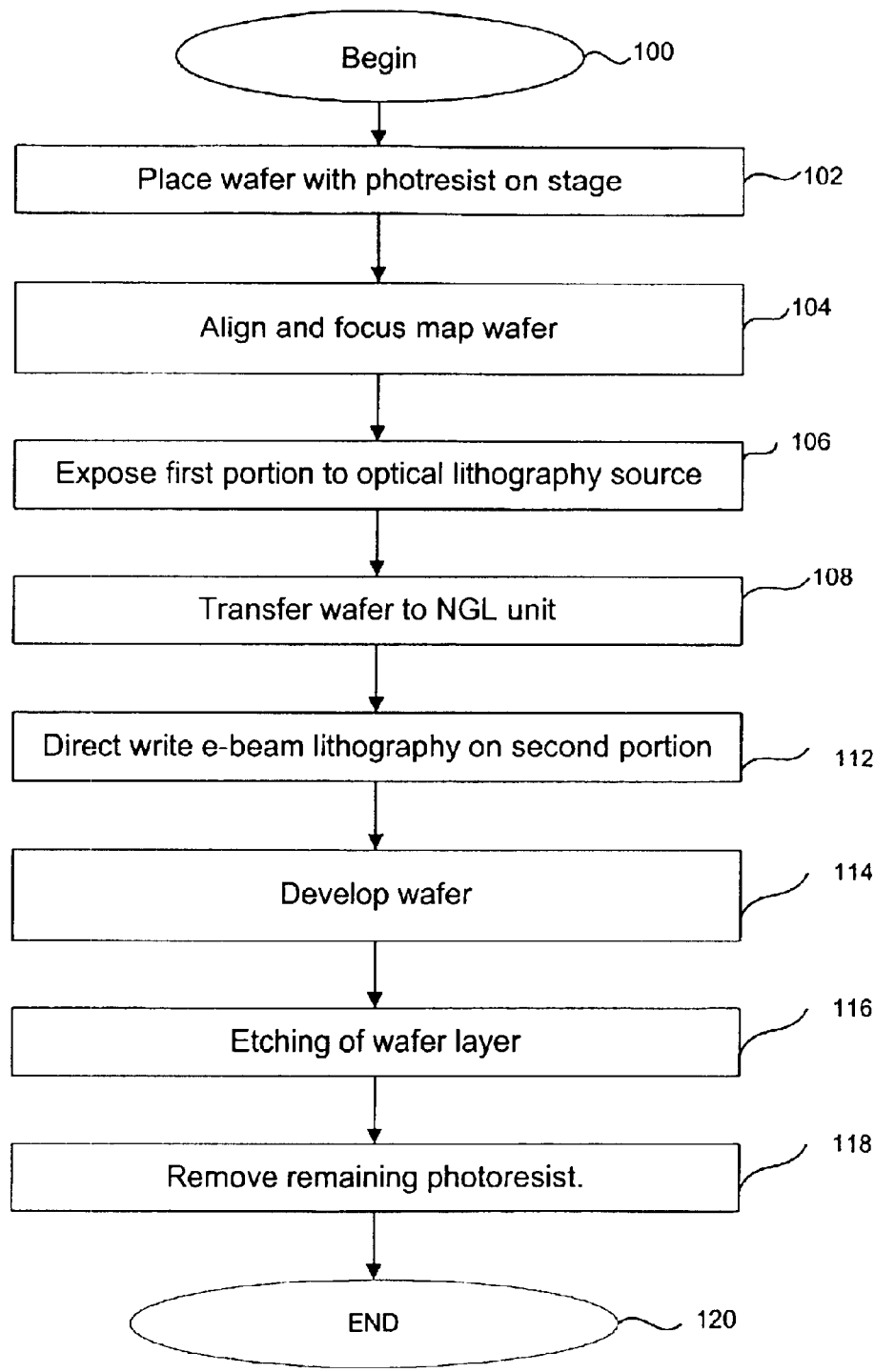
FIG. 1 is a flowchart illustrating the steps in fabricating a layer on a wafer using a dual source lithographic system in accordance with one embodiment of the present invention.

Reference will now be made in detail to preferred embodiments of the invention. Examples of the preferred embodiments are illustrated in the accompanying drawings. While the invention will be described in conjunction with these preferred embodiments, it will be understood that it is not intended to limit the invention to such preferred embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

The present invention in various embodiments provides a dual source lithography system for forming layers on a semiconductor wafer. In accordance with one embodiment of the present invention, one of the modules in the dual source system is an optical photolithography module. In optical photolithography, patterned layers are usually formed by spinning on a layer of photoresist, and projecting light through a photomask having the desired pattern onto the photoresist layer in order to expose the pattern. Typically, then, the photoresist is developed, and the exposed photoresist washed away, to form the desired pattern with the remaining photoresist. The exposed resist may be rendered soluble (positive resist) and be washed away, or insoluble (negative resist) to fix the pattern.

The throughput using optical photolithography is high but unfortunately the ability to transfer patterns onto wafers is limited in resolution. That is, the conventional optical lithography process is generally unable to resolve pattern dimensions below ½ lambda, the wavelength of the exposure source, due to diffraction effects. For sub-½ lambda device features, certain resolution enhancement techniques such as phase shifting, i.e., introducing a phase shift as the exposure wavefront passes through the mask patterns, have made it possible to increase the spatial frequency resolutions for the mask patterns. Unfortunately, these resolution enhancement techniques are expensive.

As an alternative, next generation lithography (NGL) methods such as electron beam lithography, extreme ultraviolet (EUV), and x-ray lithography are able to print patterns with higher resolution. Most use a very short wavelength exposure source. Electron beam lithography, as one alternative, directly writes onto the wafer layer (i.e., the photoresist disposed on the wafer) using a small electron scanning spot. The electron beam has a resolution so small that diffraction no longer defines the lithographic resolution. By using a focused electron beam, e-beam lithography provides the capability of writing directly on the spun-on photoresist layer of the wafer to be patterned without the need for a photomask. That is, e-beams, under the control of a computer, may be scanned and accurately positioned on a semi-conductor substrate to produce high-resolution features. Unfortunately, the throughput for e-beam direct writing is very low.

In various embodiments, the present invention provides a dual source lithography system and method that couples a first lithography source with a second lithography source to take advantage of the different characteristics of the respective lithography sources. For example, in specific embodiments, a conventional optical photolithography light source and a non-optical lithography source (i.e., a next generation lithography exposure source) are combined into one tool. By using a mechanism for switching a wafer from photolithography to a next generation lithography ("NGL") process after selected portions of the wafer layer have been patterned (or alternatively, switching from an NGL source to a conventional optical photolithography source), the overall throughput for the wafer may be increased without the high cost of ownership usually associated with NGL processes, such as e-beam lithography. Although the example has been described as combining a conventional photolithography source with a next generation lithography source, the example is illustrative and not intended to be limiting. The scope of the present invention is intended to extend to methods and apparatus combining two lithography modules and sources, whether or not the combination includes two NGL sources, one NGL source and one conventional optical source, two optical sources, two non-optical sources or any other combination of two or more lithography sources, whatever the principal of operation of the lithography sources.

FIG. 1 is a flowchart illustrating the steps in fabricating a layer of a wafer using a dual source lithographic system in accordance with one embodiment of the present invention. The process begins at a step 100. Next, at a step 102, the wafer having a photoresist layer is placed on a stage for performing photolithographic pattern formation on the wafer. As is known to those of skill in the art, photoresist is typically applied to the surface to be patterned by a "spin-on" technique. The photoresist is typically applied to the wafer and the wafer, held by a chuck, spun at a high speed in order to disperse the photoresist evenly over the surface of the wafer.

The photoresist is an organic polymer typically whose characteristics are altered when exposed to a light or e-beam source. Different photoresists exhibit different sensitivities to different wavelengths. The dose required per unit volume of photoresist for good pattern transfer is somewhat constant but may vary, for example, with resist thickness or the reflectivity of the layers underlying the photoresist. Preferably, the photoresist selected will be sensitive to both the conventional optical light source and the source used for the next generation lithography pattern transfer. In one embodiment, the photoresist material is selected to be sensitive to both optical photolithography light sources and electron beam lithography sources. In alternative embodiments, the photoresist is selected to be sensitive to both of the lithographic exposure sources. That is, the photoresist is selected to be sensitive to the lithographic exposure source used for forming the critical components of the pattern and the lithographic exposure source for forming the non-critical components of the pattern. As used herein the critical and non-critical components of the pattern refer to the writing capabilities of the lithography exposure source having write limited capabilities. For example, for an optical lithography source, its write limiting capabilities are designated by the resolution limit of the exposure source. Thus, if the resolution limit is selected as the predetermined threshold, pattern components smaller than the resolution limit will be formed using the exposure source designed for the critical components. In other words, an exposure source capable of forming higher resolution patterns will be selected for the critical components. Thus, in a specific embodiment, the predetermined threshold is the resolution limit of the lithographic exposure source used for forming the non-critical pattern components. Typically the non-critical lithography exposure source will have a much higher throughput than provided by the critical exposure source.

After the photoresist material is dispersed evenly over the wafer, the wafer is "soft-baked" to drive off solvents in the photoresist. The soft bake typically results in a more viscous resist layer.

Next, in a step 104, the pattern is aligned and focused to the wafer. Integrated circuits generally consist of various layers, each layer defined as a collection of patterns, and various layers disposed one on another to form the device or component. For example, a typical integrated circuit manufactured today may have 30 or more masking layers, approximately 10 of which are critical layers. That is, typically 10 of the layers require higher resolution lithography than the lithography capable of forming the patterns on the remaining layers.

In, order to make useful devices the patterns for different lithography steps that belong to a single structure must be aligned to one another. The first pattern transferred to a wafer usually includes a set of alignment marks, which are diffraction grating that are used as the reference when positioning subsequent patterns, to the first pattern. Each pattern layer should have an alignment feature so that it may be registered to the rest of the layers. Initially, mask registration involves image placement on the photoresist layer of the wafer. Thus, registration is a measure of the alignment between the current layer and underlying layers within the multiplayer circuitry comprising the wafer.

Next, in a step 106, selected portions of the pattern to appear on the wafer are transferred from the photomask. In conventional optical photolithography, the pattern is transferred from the photomask to the wafer layer using projection printing. That is, the wafer is separated from the photomask by a relatively large distance. Lenses or mirrors are used to focus the photomask image on the surface of the wafer. A typical projection lithography approach is to use a step and repeat procedure. That is, a particular pattern will be reproduced many times of on the same wafer in a high speed sequence of individual exposures. Both positive and negative photoresists may be used in accordance with embodiments of the present invention. As known to those of skill in the art, positive photoresist is used to create a pattern corresponding directly to the opaque patterns on the photomask. That is, when the resist is exposed to a radiation source (such as light) the exposed resist areas are dissolved when placed in a developer solution. Conversely, if the unexposed regions are dissolved away in a developer solution, the resist is considered to be a negative photoresist.

Next, in a step 108, the wafer is transferred from the conventional optical lithography module to a next generation lithography (NGL) module for patterning of the critical areas of the critical areas of the pattern. Preferably this transfer occurs by swapping the chuck/stage combination between the lithography modules. Since focus and alignment errors are chuck/stage dependent and are intensely mapped in the optical module, the wafers preferably remain on the wafer chuck/stage systems to minimize errors. That is, once a wafer is mapped for focus and alignment, the stages are swapped between the modules. Thus, the transfer may occur in an integrated dual source lithography module, suitably configured to transfer the wafer from the first lithography module (for example, the conventional optical lithography module) to the second lithography module (e.g., the NGL module). Various mechanisms are known to those of skill in the art for transferring wafers between process locations. For example, a dual wafer stage, such as manufactured by ASML, Veldhoven, The Netherlands, and used in its Twinscan Advanced Lithography System is expected to be adaptable to transfer wafers from a first lithography module to a second lithography module. Alternatively, pattern formation may occur in non-integrated lithography modules. For example, the non-critical components of a wafer can be written on one tool and carried over to a critical tool for the second exposure.

As noted above, preferably the photoresist layer formed on the wafer is sensitive to the radiation source for the second lithography module as well as the first lithography module. Methods of modifying the composition of resist compounds to improve the absorption characteristics at different exposure wavelengths are known in the art and therefore will not be described further here. Moreover, resists sensitive to both e-beam and DUV or other optical systems are commercially available. For example, Sumitomo Chemical America, Inc., of Santa Clara, Calif., provides a high resolution chemically amplified negative resist with high sensitivity and contrast known as NEB-31. NEB-31 is sensitive to both e-beam and optical exposure sources. As a further example, UV-5 photoresist, provided by Shipley Co., of Marlborough, Mass., is a positive, deep V, chemically amplified resist also sensitive to both e-beam sources as well as deep UV sources. Other resists having sensitivities to both optical and e-beam sources are known in the art and therefore will not be described further here.

It should be noted that the described sequence of forming non-critical and critical and components is intended to be illustrative and not limiting. For example, a photoresist layer may be formed on the wafer and exposed in sequence to the radiation source from the first lithography module and then the second lithography module. Although the invention is described as first exposing the non-critical areas followed by exposure of the critical areas, the invention is not so limited. For example, the critical areas may be exposed first (such as for example by e-beam direct write lithography) followed by exposure of the non-critical areas, such as through the use of conventional optical lithography.

Next, in a step 112, the critical patterning is performed. In a preferable embodiment, direct write electron beam lithography is performed. That is, an electron beam lithography exposure module directs electron energy in the form of a focused electron beam scanned across the wafer to form a sequence of high resolution (i.e., "critical pattern") areas under automated control. The plurality of exposed electron beam spots is used to build a pattern of high resolution.

The NGL module may incorporate any suitable form of next generation lithography such as, for example, e-beam direct writing, e-beam with stencil mask, laser direct writing, x-ray lithography, or extreme ultraviolet (EUV) lithography. Using this method, the high throughput of the conventional optical lithography or other first lithography module may be employed for the non-critical areas and the high resolution but low throughput of the second lithography source (i.e., an NGL source) for the critical areas. By using the second lithography exposure tool in this manner, i.e., only for the fine details on a layer and not for "fill" or coarse details, the throughput for the advanced tool can increase by a factor of 50 or more.

In a next step 114, the post exposure process steps are performed on the photoresist pattern in accordance with conventional procedures. These steps may include a post exposure bake to diffuse the photo acid generators within the photoresist and to drive off further solvent from the photoresist followed by development of the photoresist. That is, selective removal of the exposed photoresist (for a positive photoresist system) occurs using solvents which dissolve the exposed photoresist. The developed wafer is then hard baked at a high temperature in preparation for subsequent etching process steps. The remaining resist on the surface forms the desired pattern.

In a next step 116, etching is performed using the pattern formed in the remaining resist, in accordance with conventional procedures known to those of skill in the art. After etching, the remaining portions of the photoresist layer are removed in a step 118 and the process ends at a step 120.

Figure 2:
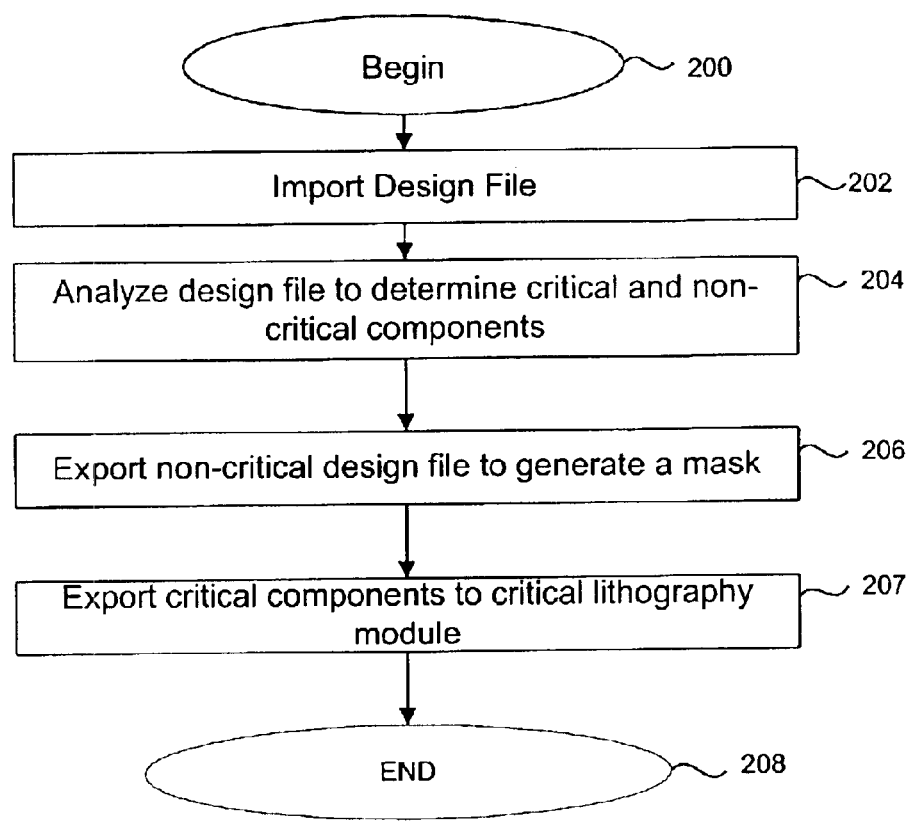
FIG. 2 is a flowchart illustrating the steps in decomposing a design file for a masking layer into critical and non-critical patterns in accordance with one embodiment of the present invention.

FIG. 2 is a flowchart illustrating the steps in decomposing a design file for a masking layer into critical and non-critical patterns in accordance with one embodiment of the present invention. The process begins at a step 200. At a step 202, the design file for the masking layer is imported by a computer system configured to decompose the design file into critical and non-critical areas. Typically, mask fabricators accept mask file design information in the format of GSDII. The GDSII format, for example, assigns recognized numbers to the various layers in the mask design being created.

In a step 204, the imported mask design file is analyzed in order to determine the portions of the pattern having non-critical dimensions and those having critical dimensions. Those pattern portions having non-critical dimensions are selected for lithography by the non-critical source, for example by conventional optical photolithography means in one embodiment. Decomposition of the design file into critical and non-critical components may be performed by one of several alternative methods. A simple approach includes decomposition by CD width, but more complex alternative procedures may be employed without resolution loss. For example, in accordance with one embodiment of the present invention, a 50 nm isolated line could be printed 100 nm in the optical (non-critical) module and the remainder printed to target by the critical module. The second method identified requires higher order decompositions, but provides drastically improved write times. Thus, according to one embodiment, optical lithography is selected to take advantage of its high throughput to form those portions of a pattern where critical dimensions, for example, do not fall below a specified threshold or alternatively, where portions of the pattern falling below the threshold are formed in a two-step process. That is, in the first step of the two-step process, even those portions of the pattern beyond the resolution limit of the non-critical lithography module are printed oversized by the non-critical module and reduced in size using the critical module in a subsequent exposure.

Due to the resolution limitations of optical lithography systems, a preferable threshold may be set at the resolution limit of the optical lithography system. The resolution of optical lithography is wavelength and NA dependent and is defined by: $CD = k1\ (\lambda/NA)$, where k1 is a constant (~0.61), $\lambda$ is the wavelength, and NA is the numerical aperture of the system. For example, a threshold of 90 nm may be specified to determine which of the patterns are critical and formed by the next generation lithography module and which are non-critical and thus formed by the first (e.g., optical) lithography module. Hence, using the example threshold, pattern features 90 nm or larger would be formed using the first (optical) lithography exposure module or method.

Preferably, the computer system decomposes the mask design file into two different files, one for creation of a photomask for non-critical areas and one for automated control of critical pattern areas such as for use with an electron beam lithography or photomasks for use with other NGL systems. According to one embodiment, the decomposed data may be optionally processed at this point with OPC (optical proximity correction) and/or PEC (proximity error correction) software. OPC is used by diffraction limited systems to compensate for nonlinear distortions introduced by optical diffraction and resist effects. Proximity error correction is mainly used in e-beam write tools to compensate for the long write times. For example, PEC may be used to modify the pattern features so that the dense pattern features possess the same exposure properties as the isolated features.

In a next step 206, the system exports the non-critical design file in order to generate a mask. For example, the exported mask design file for use with a conventional optical photolithography system will preferably be in the same format (e.g., GDSII) as the imported design file. In a step 207, the critical components are processed directly by the critical lithography module without generation of a mask.

Thus, the methods of the present invention as described will permit a transparent conversion of a mask design file requiring high resolution patterns into a mask design file suitable for use with conventional optical photolithography and a separate file for use with e-beam direct writing or alternatively another NGL system. The process ends at a step 208.

Figure 3:
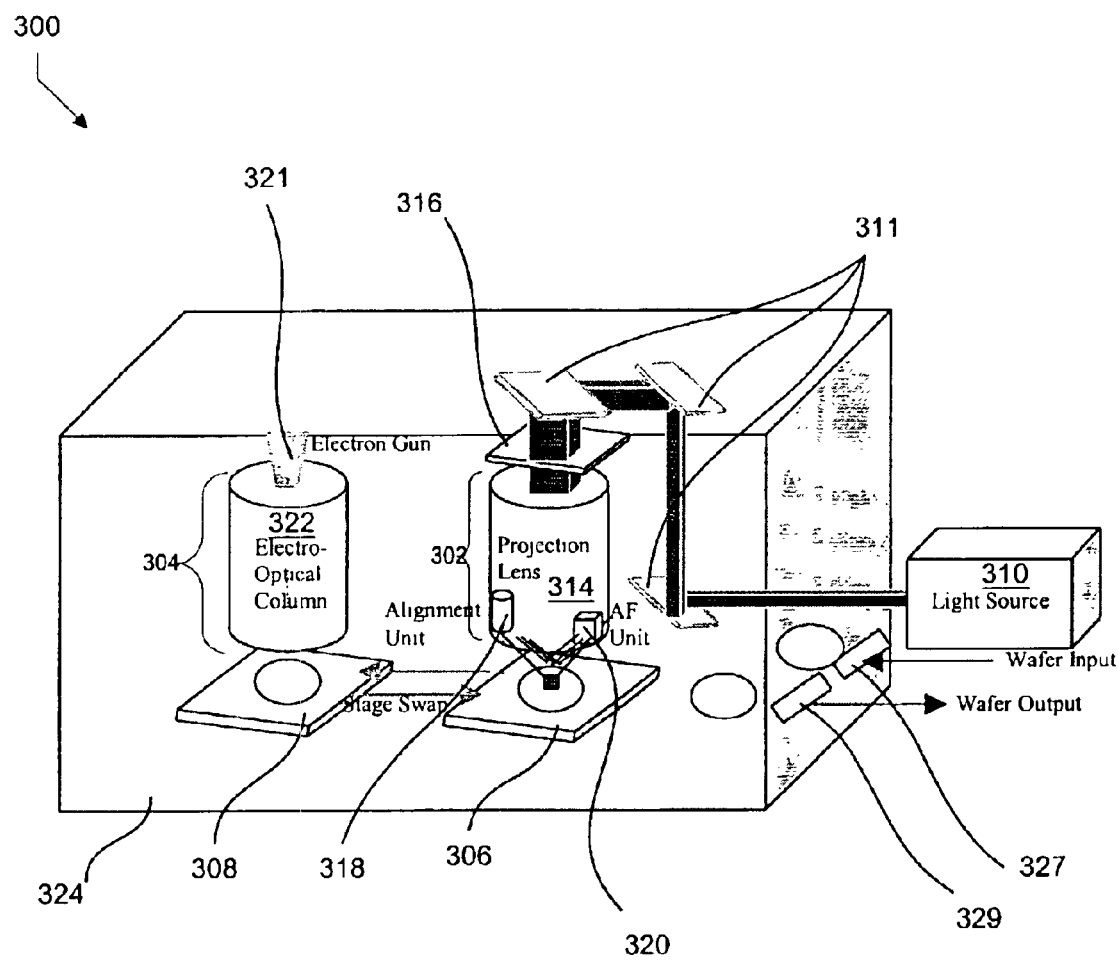
FIG. 3 is a diagram illustrating a dual source lithographic system in accordance with one embodiment of the present invention.

FIG. 3 is a diagram illustrating a perspective view of a dual source lithography system 300 in accordance with one embodiment of the present invention. The dual source lithography system 300 includes a conventional optical lithography module 302 for non-critical optical lithography exposure and an e-beam lithography module 304 for direct e-beam writing of printed features onto photoresist layers (i.e., critical pattern formation. The system 300 includes dual stages 306, 308 for transferring wafers between lithography modules 302, 304. The two stages may be arranged in any suitable configuration for transferring a wafer to or from the first (e.g., conventional optical) photolithographic module to or from the second (e.g., e-beam) lithographic module for sequential pattern formation on the same photoresist layer. For example, a dual chuck stage system such as currently used by ASML in its Twinscan Advanced Lithography System is expected to be adaptable to transfer wafers from conventional optical lithography modules such as module 302 to and from NGL modules such as e-beam module 304.

A light source 310 provides illumination of the non-critical patterns in the conventional optical lithography module 302. The light source 310 is shown transmitting light to the optical photolithography module 302 using mirrors 311. Preferably, the optical lithography module 302 is configured to perform projection lithography, using a projection lens 314 to project a pattern appearing on the photomask 316 onto the wafer supported by stage 306.

In addition to exposing the non-critical components of the pattern, the optical lithography module preferably performs alignment and focusing, such as through the use of alignment module 318 and automatic focusing ("AF") module 320. By preferably focusing and aligning the wafer in the optical lithography module, the speed offered by this module increases the overall throughput. Since the optical module is the fastest, all of the focus and alignment mapping are preferably performed in this module. As described, where the wafer is not removed from the chuck the mapped alignment data is valid for both lithographic modules. In alternative embodiments, where separate tools are used for each of the two lithographic modules, the alignment and focusing will be performed in both modules. As is typical in an optical lithography system, a stepper motor or linear motor (not shown) positions the wafer under the projection lens assembly 314.

The electron beam lithography module 304 includes an electron gun 321 for producing an electron beam and an electro-optical column 322 for deflecting the electron beam in a controlled manner. In general, the electron beam produced by the electron gun 321 is electrically and magnetically deflected by a computer-controlled deflection system in the electro-optical column 322 to write the desired pattern on the photoresist layer of the wafer located on the stage 308. In a preferable embodiment, the design file for controlling the electron beam direct writing is provided from the design files exported by the mask design file decomposition system, such as described with reference to FIG. 2. In another preferred embodiment, a chamber 324 envelopes at least the electron beam module 314. In order to perform electron beam direct writing lithography, the pattern formation preferably takes place under vacuum conditions. Thus, seals are preferably provided at the wafer input port 327 and the wafer output port 329. In an alternative embodiment, the chamber 324 is modified so as to surround only the e-beam module 304. In another alternative embodiment, critical pattern formation is formed by a laser direct write system and without subjecting the resist to vacuum conditions.

Figure 4A:
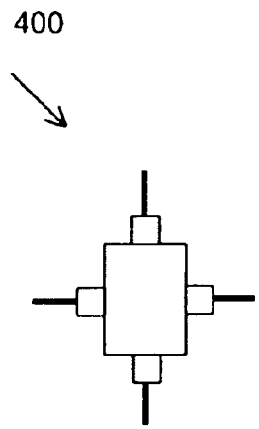
FIGS. 4A–C are diagrams illustrating an example of a simple decomposition between the critical and non-critical components in accordance with one embodiment of the present invention.
Figure 4B:
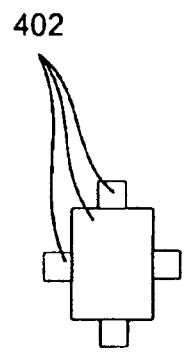
Figure 4C:
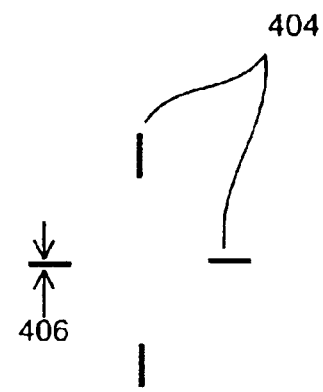

FIGS. 4A–C are diagrams illustrating an example of a simple decomposition between the critical and non-critical components in accordance with one embodiment of the present invention. FIG. 4A illustrates the original pattern design 400. The pattern design 400 may be decomposed according to embodiments of the present invention into non-critical components 402 as illustrated in FIG. 4B and critical components 404 as illustrated in FIG. 4C. For example, the critical components 404 may be characterized by a linewidth 406 smaller than the resolution limit of the non-critical lithography module, for example a conventional optical lithography module. Thus, the decomposition separates the critical components for processing by the critical lithography module.

Figure 5A:
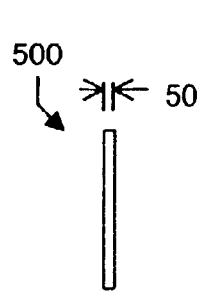
FIGS. 5A–C are diagrams illustrating an example of a complex decomposition between the critical and non-critical components in accordance with one embodiment of the present invention.
Figure 5B:
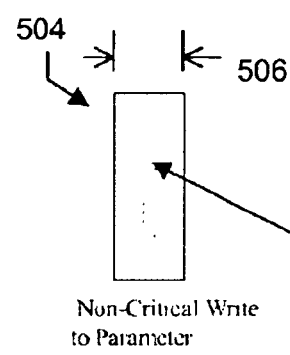
Figure 5C:
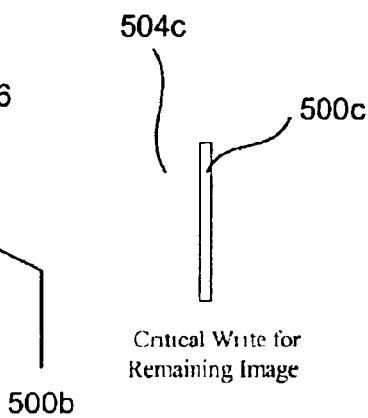

FIGS. 5A–C are diagrams illustrating an example of a complex decomposition between the critical and non-critical components in accordance with one embodiment of the present invention. FIG. 5A illustrates the original design, a pattern 500 having a pattern width 502 below the resolution limit of the non-critical lithography module. In accordance with the more complex decomposition procedure, pattern 500 may be formed by first forming a pattern 504 having a width 506 within the capabilities of the non-critical lithography module. For illustrative purposes only, the shape and size of the original design 500 is superimposed as pattern 500b on the pattern 504. Next, as illustrated in FIG. 5C, the portions of pattern 504 are removed by the critical lithography module to form the pattern 500c. For illustration purposes only, the outline of the pattern 504 removed by the critical module to form the pattern 500c is shown as pattern 504c. Thus, by forming an oversized critical component using the non-critical module, write times for the critical lithography exposure module may be reduced, thereby increasing system throughput.

In summary, a dual source lithography system and method is provided for efficiently and economically forming patterns on wafers. By combining a non-critical (e.g., conventional optical light) source with a critical (e.g., e-beam or other NGL) source, the different lithography modules complement each other for printing different portions of a wafer. That is, for example, combining a conventional optical lithography source with a second critical lithography source such as e-beam lithography allows the conventional optical lithography to be used for non-critical pattern features and the second lithography source to be used for high resolution (i.e., critical) features. By separating a mask design file into two different files for use on two different lithography systems, the high throughput of the optical lithography module is maintained while the slower speed of the higher resolution second lithography module is utilized only for the areas requiring fine detail. Thus, the combined system provides a relatively high throughput and a lower cost by avoiding expensive reticle enhancement techniques.

Although the foregoing invention has been described in some detail for purposes of clarity of understanding, it will be apparent that certain changes and modifications may be practiced within the scope of the appended claims. For example, the invention has been described with reference to using an optical lithography system for the formation of patterns which do not require fine detail. It is anticipated that in the future, as smaller and smaller semiconductor circuits are provided, current NGL techniques may be employed for the majority of circuit features. According the present invention is not limited to situations where the first lithography module used to form "coarse" pattern features is an optical lithography module, but is intended to cover all dual lithography modules where a non-critical system is used for the "coarse" patterns and a second lithography module is used for formation of the fine detail patterns, irrespective of the types of the exposure source used. Thus, in one embodiment a dual source lithography system is provided with the first lithography module a write limited optical module and the second module a write critical lithography module. However, the scope of the invention is extended to cover any combination of wafer writing techniques. For example, the first write could be laser direct write and the second could be ion milling. Accordingly, the present embodiments are to be considered as illustrative and not restrictive, and the invention is not to be limited to the details given herein, but may be modified within the scope and equivalents of the appended claims.

What is claimed is:

1. A dual source lithography system for forming a first and second component of a pattern on a wafer, one of the first and second components comprising critical components of a pattern and the other comprising non-critical components, the dual source lithography system comprising:

a first lithography exposure source for forming the first components of the pattern on a resist layer of the wafer;

a second lithography exposure source for forming the second components of the pattern on the resist layer of the wafer; and a CPU configured to import a photomask design file and export at least two design files, a first design file having features with a level of detail finer than a predetermined threshold and a second design file having a level of detail equal to or coarser than a predetermined threshold.

2. The dual source lithography system recited in claim 1 wherein the second lithography exposure source is an optical lithography exposure source contained within an optical lithography module configured to form pattern features having a level of detail equal to or coarser than a predetermined threshold and the second design file is used in controlling the forming of the second components of the pattern.

3. The dual source lithography system recited in claim 2 wherein the first lithography exposure source is a non-optical lithography exposure source contained within a non-optical lithography module configured to form pattern features having a level of detail finer than a predetermined threshold and the first design file is used in controlling the forming of the first components of the pattern.

4. The dual source lithography system recited in claim 3 wherein the non-optical lithography module is an electron beam lithography module configured for direct writing of a pattern on a photoresist layer of the wafer.

5. The dual source lithography system recited in claim 3, wherein the first lithography exposure source is one of an electron beam, x-ray, laser direct-write, e-beam with stencil mark, and extreme ultraviolet source.

6. The dual source lithography system recited in claim 5, wherein the second lithography exposure source is an optical lithography source.

7. The dual source lithography system recited in claim 6, further comprising an alignment module for aligning the wafer to the dual source lithography system.

8. The dual source lithography system recited in claim 7, wherein the alignment module is coupled to the optical lithography source.

9. The dual source lithography system recited in claim 1 wherein the first lithography exposure source is a non-optical lithography exposure source contained within a non-optical lithography module configured to form pattern features having a level of detail finer than a predetermined threshold and the first design file is used in controlling the forming of the first components of the pattern.

10. The dual source lithography system recited in claim 1, wherein the optical lithography system further comprises a focusing module for focusing the light projected from the optical lithography exposure source on the wafer.

11. The dual source lithography system recited in claim 1, further comprising a chamber surrounding the first lithography exposure source.

12. The dual source lithography system recited in claim 11, wherein the chamber is configured to provide a vacuum to the first lithography exposure source.

13. The dual source lithography system recited in claim 1, wherein the first lithography exposure source is one of an electron beam direct-write lithography source.

14. The dual source lithography system recited in claim 13 wherein the electron beam lithography source is contained in an electron beam lithography module configured for direct writing of a pattern on a photoresist layer of the wafer.

15. The dual source lithography system recited in claim 1, wherein the second lithography exposure source uses information contained within the second design file of the CPU to form pattern features having a level of detail equal to or coarser than a predetermined threshold.

16. The dual source lithography system recited in claim 15, wherein the first lithography exposure source uses information contained within the first design file of the CPU to form pattern features having a level of detail finer than the predetermined threshold.

17. The dual source lithography system recited in claim 1, wherein the first lithography exposure source uses information contained within the first design file of the CPU to form pattern features having a level of detail finer than a predetermined threshold.

18. The dual source lithography system recited in claim 1, wherein the critical components comprise high-resolution features smaller in size than the resolution limit available from the second lithography exposure source.

19. A method of forming a pattern on a wafer, the method comprising:

providing a first design file that contains pattern information concerning critical components of the pattern enabling the formation of pattern features having a level of detail equal to or finer than a predetermined threshold;

providing a second design file that contains pattern information concerning non-critical components of the pattern enabling the formation of pattern features having a level of detail greater than the predetermined threshold;

forming the first critical components of a pattern on a resist layer of a wafer by exposing the resist layer of the wafer to an first lithography exposure source in accordance with the pattern information in the first design file; and forming the second non-critical components of a pattern on the resist layer of the wafer by exposing the resist to a second lithography exposure source in accordance with the pattern information in the second design file.

20. The method of forming a pattern on a wafer as recited in claim 19, wherein the first lithography exposure source is a non-optical exposure source.

21. The method of forming a pattern on a wafer as recited in claim 20, wherein the second lithography exposure source is an optical exposure source.

22. The method of forming a pattern on a wafer as recited in claim 20, wherein the non-optical exposure source is provided by an electron beam lithography module configured for direct writing of a pattern on a photoresist layer of the wafer.

23. The method of forming a pattern on a wafer as recited in claim 20, wherein the resist layer is selected to be sensitive to both the first and second exposure sources.

24. The method of forming a pattern on a wafer as recited in claim 20, wherein the resist layer is selected to be sensitive to both electron beam lithography and optical lithography.

25. The method of forming a pattern on a wafer as recited in claim 19, wherein the non-optical exposure source is one of an electron beam, x-ray, laser direct-write and extreme ultraviolet source.

26. A dual source lithography system for forming a first and second component of a pattern on a wafer, first component comprising critical components of a pattern and the the second component comprising non-critical components, the dual source lithography system comprising:

a first lithography exposure source for forming the first components of the pattern on a resist layer of the wafer;

a second lithography exposure source for forming the second components of the pattern on the resist layer of the wafer; and a CPU including a mask design decomposition system configured to import a photomask design file and export at least two component design files derived from the photomask design file, a first component design file that is associated with the critical components and is configured to pattern features having a level of detail finer than a predetermined threshold and a second component design file that is associated with the non-critical components and is configured to pattern features having a level of detail equal to or coarser than the predetermined threshold.

27. The dual source lithography system of claim 26 wherein the CPU mask design decomposition system enables the processing of the photomask design file such that a portion of the critical components of the photomask design file are reconfigured as non-critical components and are exported as part of the second design file associated with the non-critical components that are configured to pattern features having a level of detail equal to or coarser than the predetermined threshold.

28. The dual source lithography system of claim 26 wherein the second lithography exposure source is an optical lithography source.

29. The dual source lithography system of claim 28 wherein the predetermined threshold is defined by the resolution limit of the optical lithography source comprising the second lithography exposure source.

30. The dual source lithography system of claim 26 wherein the first lithography exposure source is a non-optical lithography source.

31. The dual source lithography system recited in claim 30, wherein the first lithography exposure source is one of an electron beam source, an x-ray source, a laser direct-write source, an electron beam with stencil mark, and extreme ultraviolet source.

* * * * *